(12) United States Patent
Fujita et al.

(10) Patent No.: US 11,955,777 B2
(45) Date of Patent: Apr. 9, 2024

(54) OPTICAL COMBINER AND LASER APPARATUS

(71) Applicant: FUJIKURA LTD., Tokyo (JP)

(72) Inventors: Tomoyuki Fujita, Sakura (JP);
Ryokichi Matsumoto, Sakura (JP);
Yutaka Yamaguchi, Sakura (JP);
Takuya Kobayashi, Sakura (JP);
Kiwamu Suzuki, Sakura (JP)

(73) Assignee: Fujikura Ltd., Tokyo (JP)

( * ) Notice: Subject to any disclaimer, the term of this patent is extended or adjusted under 35 U.S.C. 154(b) by 39 days.

(21) Appl. No.: 17/631,750

(22) PCT Filed: Sep. 24, 2020

(86) PCT No.: PCT/JP2020/035961
§ 371 (c)(1),
(2) Date: Jan. 31, 2022

(87) PCT Pub. No.: WO2021/065657
PCT Pub. Date: Apr. 8, 2021

(65) Prior Publication Data
US 2022/0276433 A1    Sep. 1, 2022

(30) Foreign Application Priority Data

Sep. 30, 2019  (JP) ................................ 2019-178523
Sep. 30, 2019  (JP) ................................ 2019-178605

(51) Int. Cl.
*H01S 5/40* (2006.01)
*B23K 26/06* (2014.01)
(Continued)

(52) U.S. Cl.
CPC ........ *H01S 5/4012* (2013.01); *B23K 26/0604* (2013.01); *B23K 26/064* (2015.10);
(Continued)

(58) Field of Classification Search
None
See application file for complete search history.

(56) References Cited

U.S. PATENT DOCUMENTS

2009/0175301 A1   7/2009 Li et al.
2014/0205236 A1   7/2014 Noguchi et al.
(Continued)

FOREIGN PATENT DOCUMENTS

CN   103975263 A      8/2014
CN   208127619 U  *  11/2018
(Continued)

OTHER PUBLICATIONS

Li et al., Machine Translation of CN 208127619 U, Nov. 2018. (Year: 2018).*

(Continued)

*Primary Examiner* — Michelle R Connelly
(74) *Attorney, Agent, or Firm* — Osha Bergman Watanabe & Burton LLP

(57) ABSTRACT

An optical combiner includes: a plurality of first input optical fibers that each include a core; a bridge fiber that includes a bridge input surface connected to the cores of the plurality of first input optical fibers, a diameter reduction portion having a diameter that decreases away from the bridge input surface along an optical axis of the optical combiner, and a bridge output surface located opposite to the bridge input surface along the optical axis; an intermediate optical fiber that includes a core connected to the bridge output surface of the bridge fiber; a second input optical fiber that includes a core; and an output optical fiber that includes a first optical waveguide connected to the core of the intermediate optical fiber, and a second optical waveguide connected to the core of the second input optical fiber.

13 Claims, 8 Drawing Sheets

(51) Int. Cl.
  *B23K 26/064* (2014.01)
  *G02B 6/036* (2006.01)
  *G02B 6/04* (2006.01)
  *G02B 6/42* (2006.01)

(52) U.S. Cl.
  CPC ......... *G02B 6/036* (2013.01); *G02B 6/03644* (2013.01); *G02B 6/04* (2013.01); *G02B 6/4202* (2013.01); *G02B 6/4296* (2013.01)

(56) References Cited

U.S. PATENT DOCUMENTS

| | | |
|---|---|---|
| 2016/0161674 A1 | 6/2016 | Tanaka |
| 2016/0211639 A1 | 7/2016 | Holland |
| 2017/0235055 A1 | 8/2017 | Fujita et al. |
| 2018/0147661 A1* | 5/2018 | Salokatve .............. B23K 26/22 |
| 2018/0203186 A1* | 7/2018 | Kitahara ............. H01S 3/06729 |

FOREIGN PATENT DOCUMENTS

| | | |
|---|---|---|
| CN | 109791252 A | 5/2019 |
| JP | 2009-145888 A | 7/2009 |
| JP | 2017-219628 A | 12/2017 |
| JP | 2018136379 A | 8/2018 |
| JP | 2018-527184 A | 9/2018 |
| WO | 2009/077637 A1 | 6/2009 |
| WO | WO-2010120958 A1 * | 10/2010 ............. G02B 6/262 |
| WO | 2018/011456 A1 | 1/2018 |
| WO | 2018/063452 A1 | 4/2018 |
| WO | 2018/217298 A1 | 11/2018 |

OTHER PUBLICATIONS

Extended European Search Report issued in corresponding European Patent Application No. 20872318.9, dated Sep. 11, 2023, (8 pages).

* cited by examiner

OPTICAL COMBINER AND LASER APPARATUS

CROSS-REFERENCE TO RELATED APPLICATIONS

This is a national stage of International Patent Application No. PCT/JP2020/035961, filed on Sep. 24, 2020, and claims priority from Japanese Patent Application Nos. 2019-178523, filed on Sep. 30, 2019, and 2019-178605, filed on Sep. 30, 2019. The content of these priority applications are incorporated herein by reference.

TECHNICAL FIELD

The present invention relates to an optical combiner and a laser apparatus, and more particularly to an optical combiner that combines laser beams from a plurality of input optical fibers and outputs the combined laser beam from an optical fiber.

BACKGROUND

In the field of laser processing, it is important to change a beam profile of a laser beam being applied to a workpiece depending on a material or a thickness of the workpiece in order to improve processing performance such as a processing rate, a process quality, and the like. From this point of view, there has been developed in recent years a technique of forming a plurality of optical waveguides in an output optical fiber and controlling a laser beam to be introduced into each of those optical waveguides to change a beam profile of a laser beam directed to a workpiece into a desired form.

For example, Patent Literature 1 discloses an optical combiner for introducing a laser beam into an output optical fiber having a center core and an outer core located so as to surround the center core as optical waveguides, wherein the optical combiner includes a plurality of optical fibers (inner optical fibers) located on an inner side thereof so as to correspond to the center core of the output optical fiber and a plurality of optical fibers (outer optical fibers) located so as to surround the inner optical fibers with an annular arrangement to correspond to the outer core of the output optical fiber (see FIGS. 8a and 8b). With the conventional arrangement disclosed in Patent Literature 1, the diameter of the inner optical fibers needs to be smaller than the diameter of the outer optical fibers in order to avoid an increased diameter of the output optical fiber. When the inner optical fibers have a small diameter, the mechanical strength of the inner optical fibers is reduced, such that breakage or cutting of the optical fibers are likely to occur. Furthermore, such inner optical fibers become difficult to manufacture. In view of this, it may be difficult to increase the number of the inner optical fibers. Therefore, it is difficult to increase the power of a laser beam introduced into the center core of the output optical fiber, to which the inner optical fibers are connected. As a result, it is also difficult to adjust output balance between a laser beam propagating through the center core of the output optical fiber and a laser beam propagating through the outer core of the output optical fiber.

PATENT LITERATURE

Patent Literature 1: JP 2009-145888 A

SUMMARY

One or more embodiments of the present invention provide an optical combiner that can readily be manufactured with capability of directing a laser beam into each of a first optical waveguide and a second optical waveguide of an output optical fiber.

Furthermore, one or more embodiments of the present invention provide a laser apparatus capable of outputting a laser beam having a desired beam profile.

According to a first aspect of one or more embodiments of the present invention, there is provided an optical combiner that can readily be manufactured with capability of directing a laser beam into each of a first optical waveguide and a second optical waveguide of an output optical fiber. This optical combiner has a plurality of first input optical fibers each including a core, a bridge fiber having a bridge input surface connected to the cores of the plurality of first input optical fibers, a diameter reduction portion having a diameter gradually reduced away from the bridge input surface along an optical axis, and a bridge output surface located opposite to the bridge input surface along the optical axis, an intermediate optical fiber including a core connected to the bridge output surface of the bridge fiber, at least one second input optical fiber including a core, and an output optical fiber including a first optical waveguide connected to the core of the intermediate optical fiber and a second optical waveguide connected to the core of the at least one second input optical fiber.

According to a second aspect of one or more embodiments of the present invention, there is provided a laser apparatus capable of outputting a laser beam having a desired beam profile. The laser apparatus has at least one first laser source operable to generate a first laser beam, at least one second laser source operable to generate a second laser beam, and the aforementioned optical combiner. At least one of the plurality of first input optical fibers of the optical combiner is connected to the at least one first laser source. The at least one second input optical fiber of the optical combiner is connected to the at least one second laser source.

DETAILED DESCRIPTION

Figure 1:
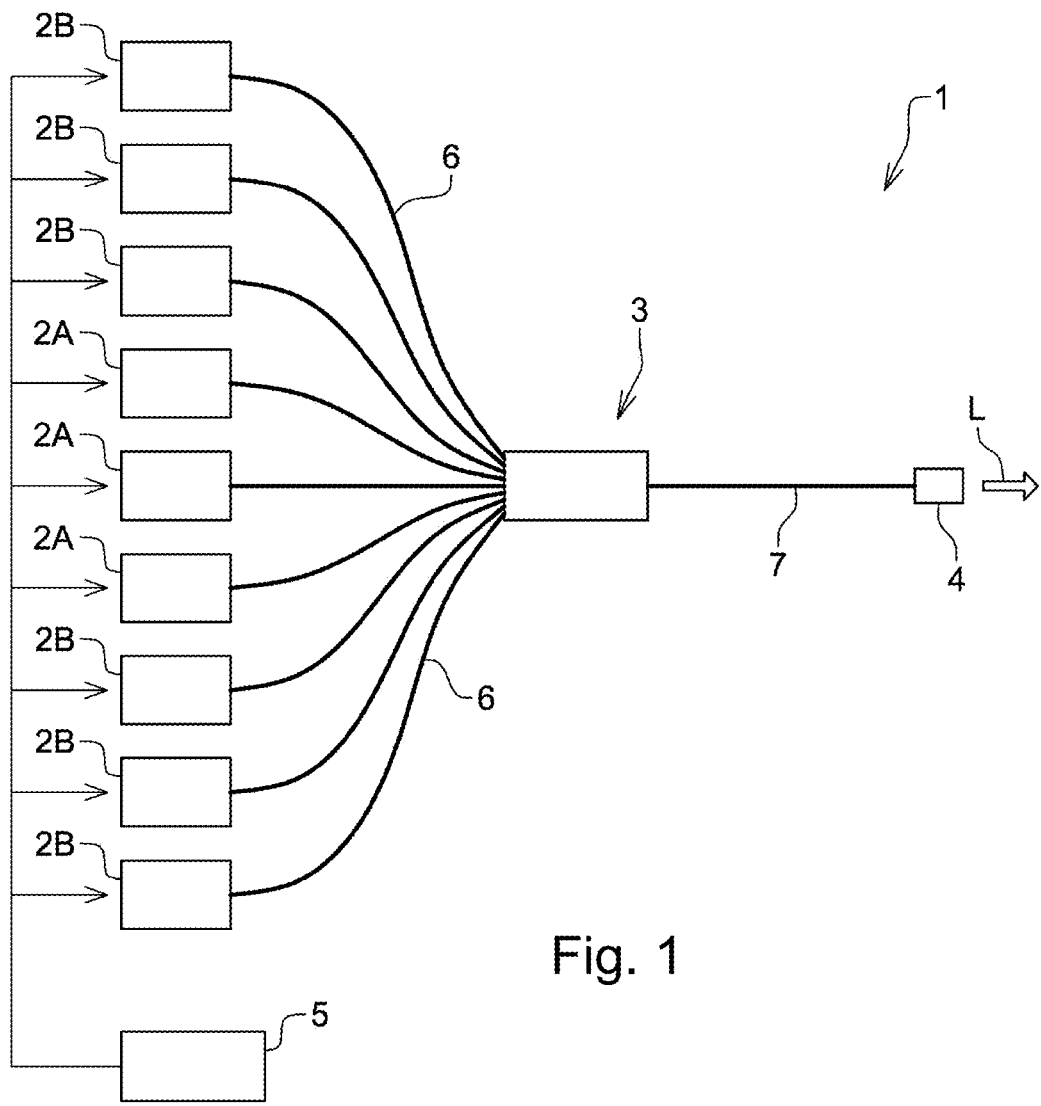
FIG. 1 is a schematic block diagram showing a configuration of a laser apparatus according to one or more embodiments of the present invention.

Embodiments of an optical combiner and a laser apparatus having an optical combiner according to the present invention will be described in detail below with reference to FIGS. 1 to 8. In FIGS. 1 to 8, the same or corresponding components are denoted by the same or corresponding reference numerals and will not be described below repetitively. Furthermore, in FIGS. 1 to 8, the scales or dimensions of components may be exaggerated, or some components may be omitted. Unless mentioned otherwise, in the following description, terms such as "first," "second," etc. are only used to distinguish one component from another and are not used to indicate a specific order or a specific sequence.

FIG. 1 is a schematic block diagram showing a configuration of a laser apparatus 1 according to one or more embodiments of the present invention. As shown in FIG. 1, the laser apparatus 1 of one or more embodiments has first laser sources 2A and second laser sources 2B operable to generate a laser beam, an optical combiner 3 to which laser beams are inputted from the respective laser sources 2A and 2B, a laser emission portion 4 provided on a downstream end of the optical combiner 3, and a controller 5 operable to control the laser sources 2A and 2B. Each of the laser sources 2A and 2B and the optical combiner 3 are connected to each other by an optical fiber 6. The optical combiner 3 and the laser emission portion 4 are connected to each other by an optical fiber 7. For example, a fiber laser or a semiconductor laser can be used for the laser sources 2A and 2B. Although the laser apparatus 1 of one or more embodiments includes three laser sources 2A and six laser sources 2B, the numbers of the laser sources 2A and 2B are not limited to those values. Unless otherwise mentioned herein, the term "downstream" refers to a direction in which a laser beam propagates from each of the laser sources 2A and 2B to the laser emission portion 4, and the term "upstream" refers to an opposite direction thereto.

In this laser apparatus 1, first laser beams generated in the first laser sources 2A and second laser beams generated in the second laser sources 2B respectively propagate through the optical fibers 6 to the optical combiner 3. In the optical combiner 3, laser beams from a plurality of laser sources 2A and 2B are combined and outputted to the optical fiber 7. A high-power laser beam L outputted to the optical fiber 7 is emitted from the laser emission portion 4, for example, toward a workpiece.

Figure 2:
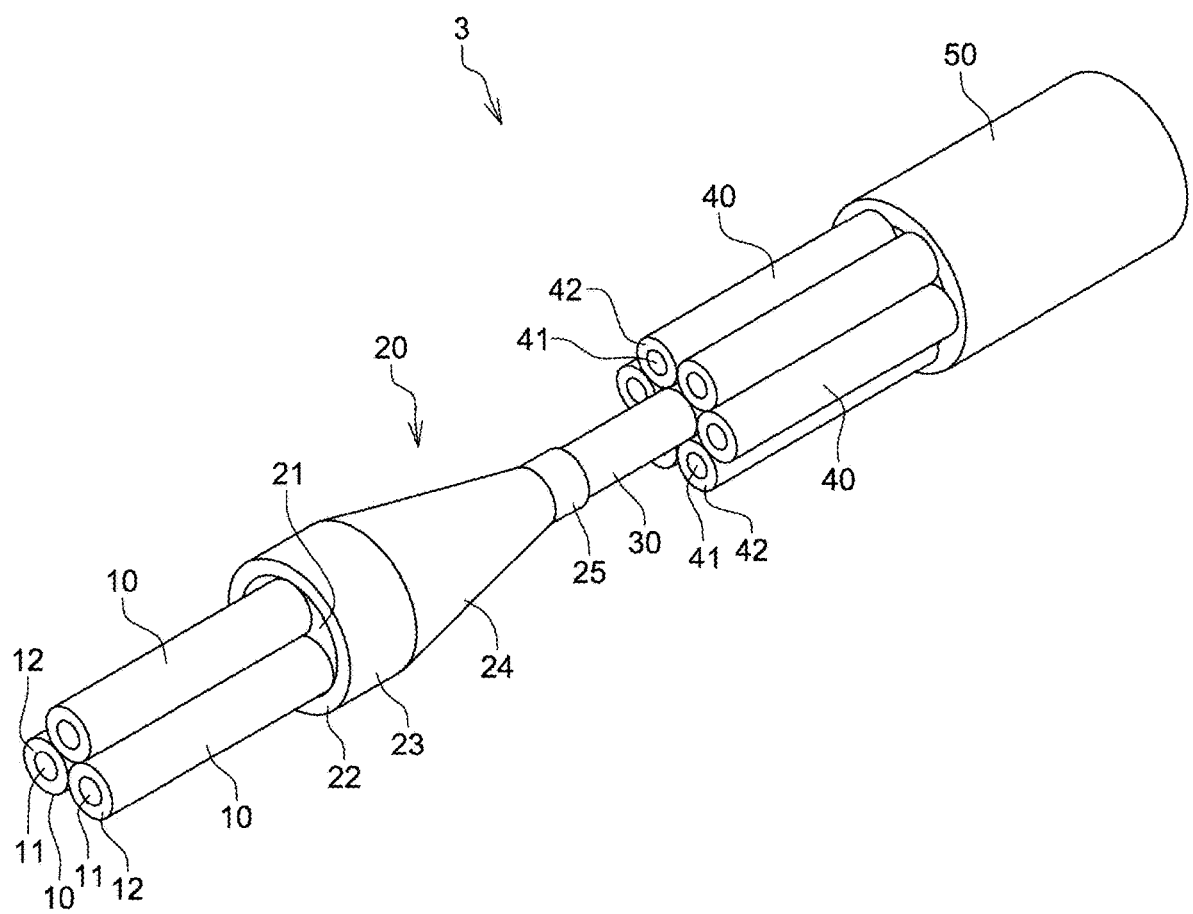
FIG. 2 is a perspective view showing an optical combiner in the laser apparatus of FIG. 1.
Figure 3:
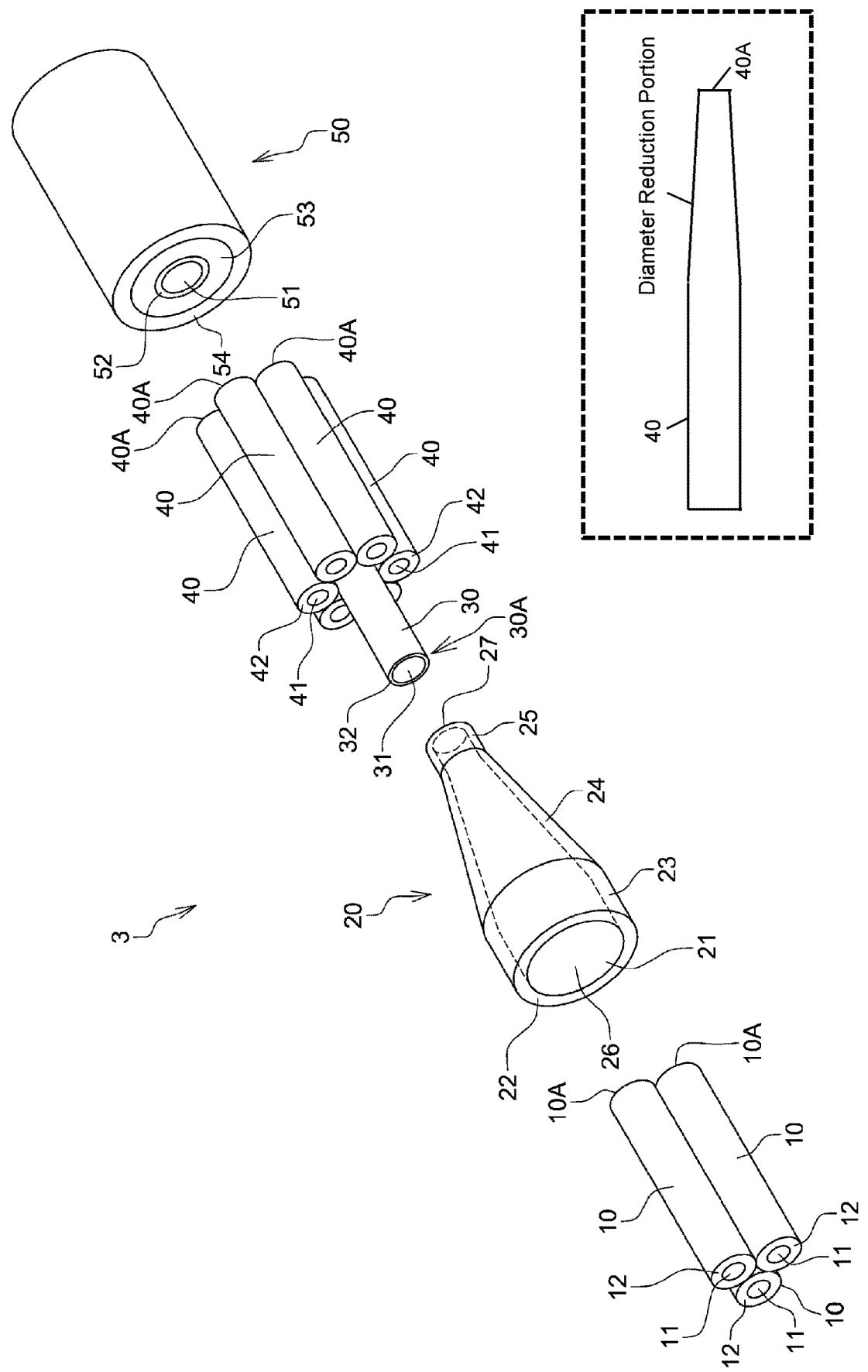
FIG. 3 is an exploded perspective view of the optical combiner of FIG. 2.

FIG. 2 is a perspective view showing the optical combiner 3, and FIG. 3 is an exploded perspective view thereof. As shown in FIGS. 2 and 3, the optical combiner 3 of one or more embodiments includes a plurality of first input optical fibers 10, each of which is formed by at least a portion of the optical fiber 6 extending from the first laser source 2A, a bridge fiber 20 connected to those first input optical fibers 10, an intermediate optical fiber 30 connected to the bridge fiber 20, a plurality of second input optical fibers 40, each of which is formed by at least a portion of the optical fiber 6 extending from the second laser source 2B, and an output optical fiber 50, which is formed by at least a portion of the aforementioned optical fiber 7.

As shown in FIGS. 2 and 3, in one or more embodiments, the three first input optical fibers 10 are connected to the bridge fiber 20 in a state in which the input optical fibers 10 are held in contact with each other. Each of the first input optical fibers 10 has a core 11 and a cladding 12 that surrounds an outer circumference of the core 11. The cladding 12 has a refractive index lower than a refractive index of the core 11. Thus, an interior of the core 11 forms an optical waveguide that allows the first laser beam from the first laser source 2A to propagate therethrough. In this manner, the first input optical fiber 10 is configured to allow the first laser beam from the first laser source 2A to propagate through the interior of the core 11 and emit the first laser beam from an output end 10A (see FIG. 3). Each of the first input optical fibers 10 has a covering layer (not shown) that surrounds an outer circumference of the cladding 12 at a location away from the bridge fiber 20.

The bridge fiber 20 has a core 21 and a cladding 22 that surrounds an outer circumference of the core 21. The cladding 22 has a refractive index lower than a refractive index of the core 21. Thus, an interior of the core 21 forms an optical waveguide that allows the first laser beams to propagate therethrough. The bridge fiber 20 with such a core-cladding structure includes a first cylindrical portion 23 extending along an optical axis with a fixed outside diameter, a diameter reduction portion 24 having an outside diameter gradually reduced from the first cylindrical portion 23 along the optical axis, and a second cylindrical portion 25 extending from the diameter reduction portion 24 along the optical axis with a fixed outside diameter. The first cylindrical portion 23 has an end face that serves as a bridge input surface 26 to which the output ends 10A of the respective first input optical fibers 10 are connected by fusion splicing. An end face of the second cylindrical portion 25 that is located opposite to the bridge input surface 26 along the optical axis serves as a bridge output surface 27 to which an input end 30A of the intermediate optical fiber 30 (see FIG. 3) is connected by fusion splicing. The size of the core 21 of the bridge fiber 20 on the bridge input surface 26 is large enough to include therein all of the cores 11 of the first input optical fibers 10. The first input optical fibers 10 and the bridge fiber 20 are connected to each other by fusion splicing in a state in which all of the cores 11 of the first input optical fibers 10 are located within an area of the core 21 on the bridge input surface 26 of the bridge fiber 20. In this manner, the bridge fiber 20 is configured to allow the first laser beams emitted from the output ends 10A of the first input optical fibers 10 to propagate through an interior of the core 21 and reduce the beam diameter of the first laser beams through the diameter reduction portion 24. In order to suppress reflection of the first laser beams when the first laser beams are introduced into the core 21 of the bridge fiber 20 from the cores 11 of the first input optical fibers 10, in one or more embodiments, the core 21 of the bridge fiber 20 may have a refractive index that is substantially the same as a refractive index of the cores 11 of the first input optical fibers 10.

The intermediate optical fiber 30 has a core 31 and a cladding 32 that surrounds an outer circumference of the core 31. The cladding 32 has a refractive index lower than a refractive index of the core 31. Thus, an interior of the core 31 forms an optical waveguide that allows the first laser beams to propagate therethrough. The size of the core 31 of the intermediate optical fiber 30 is equal to or larger than the size of the core 21 of the bridge fiber 20 on the bridge output surface 27. The bridge fiber 20 and the intermediate optical fiber 30 are connected to each other by fusion splicing in a state in which the core 21 of the bridge fiber 20 on the bridge output surface 27 is located within an area of the core 31 of the intermediate optical fiber 30. In this manner, the intermediate optical fiber 30 is configured to allow the first laser beams propagated from the bridge fiber 20 to propagate through an interior of the core 31. In order to suppress reflection of the first laser beams when the first laser beams are introduced into the core 31 of the intermediate optical fiber 30 from the core 21 of the bridge fiber 20, in one or more embodiments, the core 31 of the intermediate optical fiber 30 may have a refractive index that is substantially the same as a refractive index of the core 21 of the bridge fiber 20.

In one or more embodiments, the six second input optical fibers 40 are arranged so as to surround the intermediate optical fiber 30 in a state in which the second input optical fibers 40 are held in contact with an outer circumferential surface of the intermediate optical fiber 30. The adjacent second input optical fibers 40 are held in contact with each other. Each of the second input optical fibers 40 has a core 41 and a cladding 42 that surrounds an outer circumference of the core 41. The cladding 42 has a refractive index lower than a refractive index of the core 41. Thus, an interior of the core 41 forms an optical waveguide that allows the second laser beam from the second laser source 2B to propagate therethrough. In this manner, the second input optical fiber 40 is configured to allow the second laser beam from the second laser source 2B to propagate through the interior of the core 41 and emit the second laser beam from an output end 40A (see FIG. 3). The same type of optical fibers as the aforementioned first input optical fibers 10 may be used for the second input optical fibers 40. Each of the second input optical fibers 40 has a covering layer (not shown) that surrounds an outer circumference of the cladding 42 at a location away from the output optical fiber 50.

Figure 4:
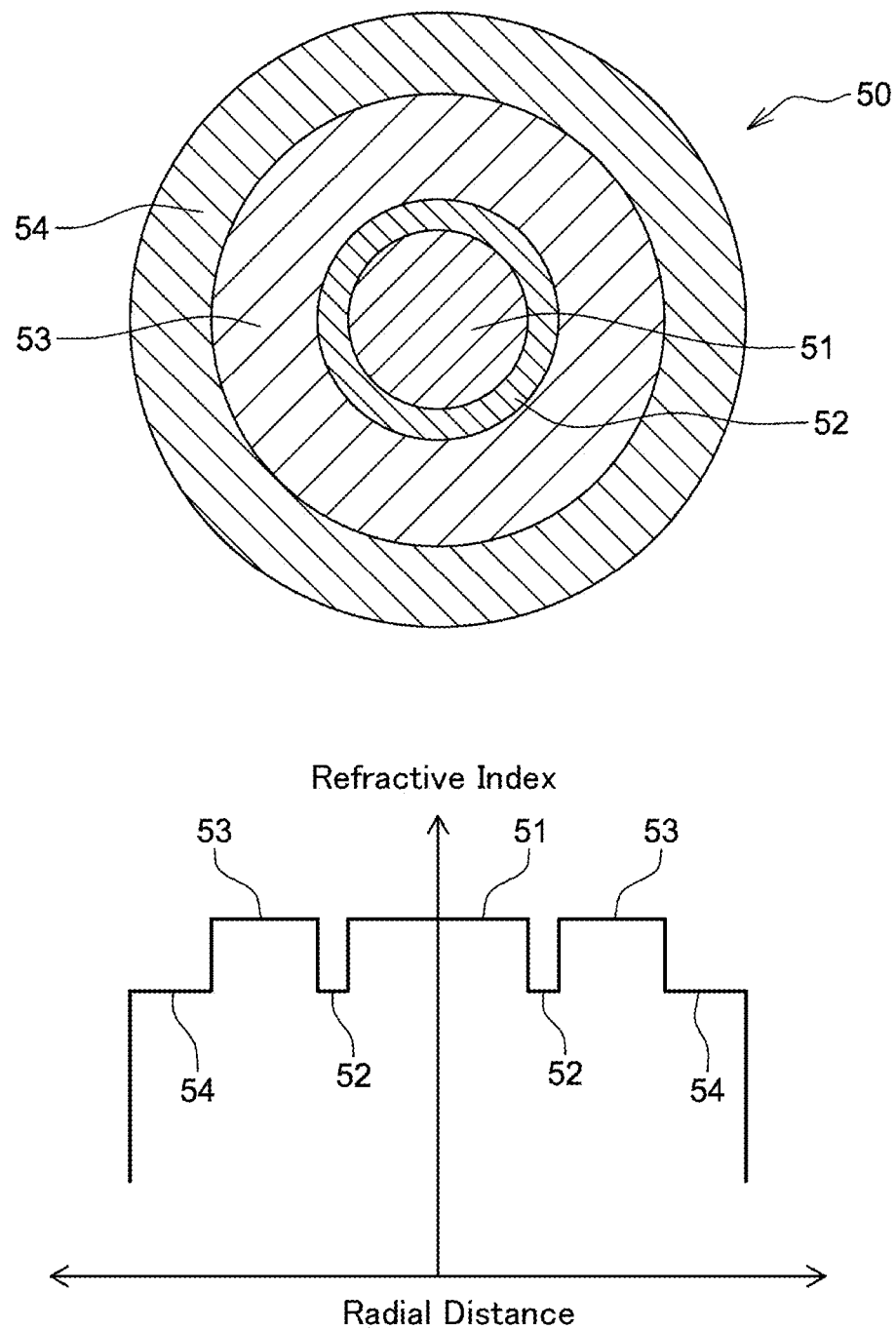
FIG. 4 is a diagram showing a cross-section of an output optical fiber of the optical combiner of FIG. 3 along with a radial refractive index distribution.

FIG. 4 shows a cross-section of the output optical fiber 50 along with a radial refractive index distribution. As shown in FIG. 4, the output optical fiber 50 has a center core 51, an inner cladding 52 that surrounds an outer circumference of the center core 51, a ring core 53 that surrounds an outer circumference of the inner cladding 52, and an outer cladding 54 that surrounds an outer circumference of the ring core 53. The inner cladding 52 has a refractive index lower than refractive indices of the center core 51 and the ring core 53. The outer cladding 54 has a refractive index lower than a refractive index of the ring core 53. Thus, an interior of the center core 51 forms a first optical waveguide that allows a laser beam to propagate therethrough, and the interior of the ring core 53 forms a second optical waveguide that allows a laser beam to propagate therethrough. In one or more embodiments, the outer cladding 54 is formed around the ring core 53 as a low-refractive-index medium having a refractive index lower than the refractive index of the ring core 53. Such a low-refractive-index medium is not limited to a covering layer such as the outer cladding 54. For example, an air layer may be formed around the ring core 53 and may be used as a low-refractive-index medium. The output optical fiber 50 has a covering layer (not shown) that surrounds an outer circumference of the outer cladding 54 at a location away from the intermediate optical fiber 30 and the second input optical fibers 40.

Figure 5:
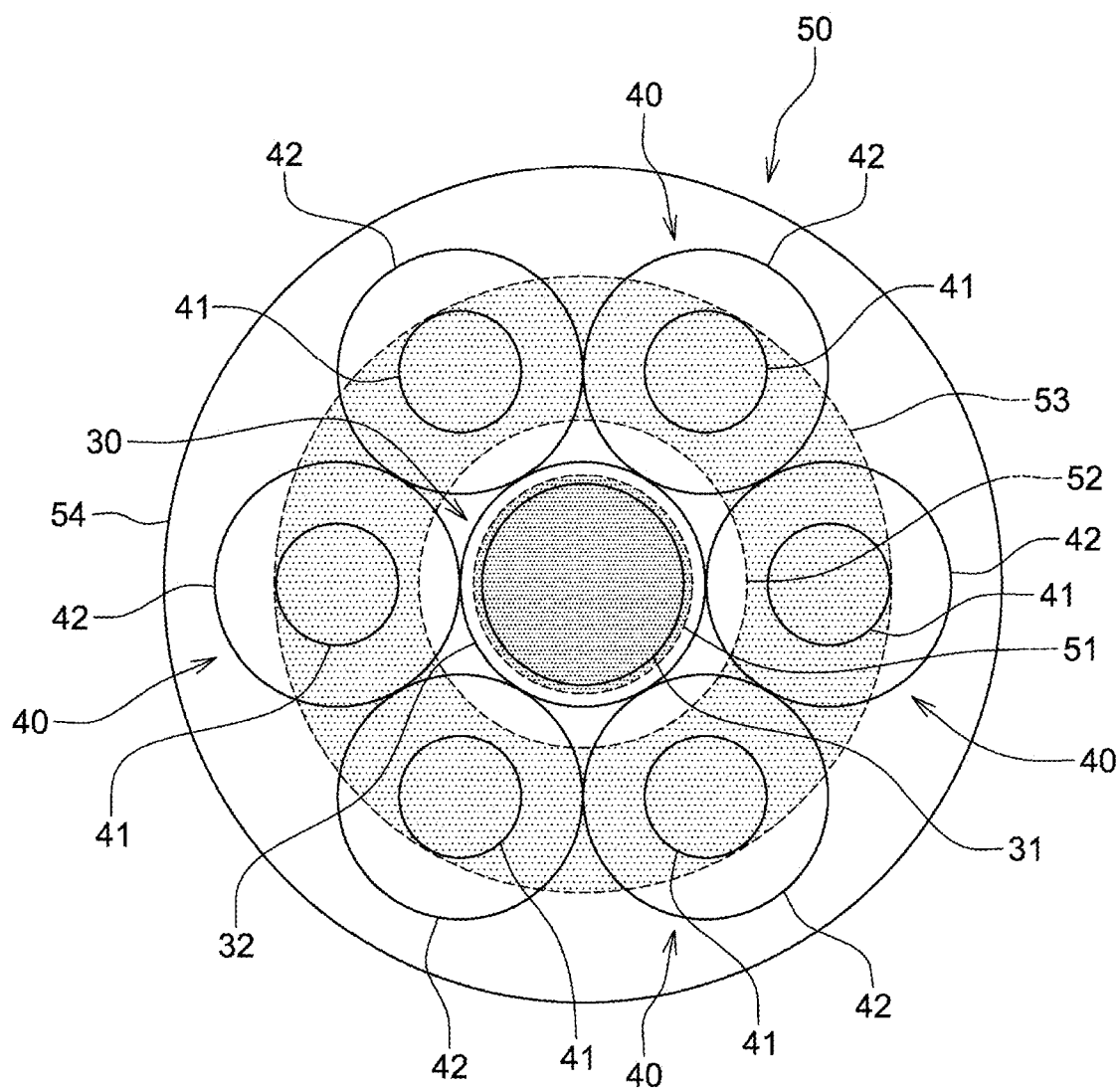
FIG. 5 is a schematic diagram showing connection of an intermediate optical fiber and second input optical fibers with the output optical fiber in the optical combiner of FIG. 3.

The output end of the intermediate optical fiber 30 and the output ends 40A of the second input optical fibers 40 are respectively connected to the output optical fiber 50 by fusion splicing. FIG. 5 is a schematic diagram showing connection of the intermediate optical fiber 30 and the second input optical fibers 40 with the output optical fiber 50. In one or more embodiments, the size of the center core 51 of the output optical fiber 50 is larger than the size of the core 31 of the intermediate optical fiber 30. As shown in FIG. 5, the intermediate optical fiber 30 and the output optical fiber 50 are connected to each other by fusion splicing in a state in which the core 31 of the intermediate optical fiber 30 is located within an area of the center core 51 of the output optical fiber 50 (the inner hatched area). Furthermore, the size of the ring core 53 of the output optical fiber 50 is large enough to include therein all of the cores 41 of the second input optical fibers 40. As shown in FIG. 5, the second input optical fibers 40 and the output optical fiber 50 are connected to each other by fusion splicing in a state in which all of the cores 41 of the second input optical fibers 40 are located with an area of the ring core 53 of the output optical fiber 50 (the outer hatched area).

With this configuration, a first laser beam generated by each of the first laser sources 2A propagates through the core 11 of the first input optical fiber 10 and enters the core 21 of the bridge fiber 20 from the bridge input surface 26 of the bridge fiber 20. The laser beam that has entered the core 21 of the bridge fiber 20 propagates through the core 21 of the bridge fiber 20 while it is reflected on an interface between the core 21 and the cladding 22. The laser beam is reduced in diameter by the diameter reduction portion 24 and then introduced into the core 31 of the intermediate optical fiber 30 from the bridge output surface 27. The laser beam that has been introduced to the core 31 of the intermediate optical fiber 30 propagates through the interior of the core 31 and enters the center core 51 of the output optical fiber 50. Then the laser beam propagates through the interior of the center core 51 as the first optical waveguide. The laser beam is eventually emitted from the laser emission portion 4 (see FIG. 1). Furthermore, a second laser beam generated by each of the second laser sources 2B propagates through the core 41 of the second input optical fiber 40 and enters the ring core 53 of the output optical fiber 50. The laser beam that has entered the ring core 53 of the output optical fiber 50 propagates through the interior of the ring core 53 as the second optical waveguide. The laser beam is eventually emitted from the laser emission portion 4 (see FIG. 1).

In one or more embodiments, when laser beams propagating through the cores 11 of the first input optical fibers 10 and the cores 41 of the second input optical fibers 40 are introduced into the center core 51 and the ring core 53 of the output optical fiber 50, respectively, light propagating through the cores 11 of the first input optical fibers 10 is reduced in beam diameter in the bridge fiber 20 and then introduced into the center core 51 of the output optical fiber 50. Therefore, the first input optical fibers 10 can be connected to the bridge fiber 20 without reduction of the diameter of the first input optical fibers 10. Accordingly, the mechanical strength of the first input optical fibers 10 can be maintained. Thus, the optical combiner 3 can readily be manufactured. Furthermore, the number of the first input optical fibers 10 can be increased without reduction of the diameter of the first input optical fibers 10. Therefore, the power of laser beams introduced to the center core 51 of the output optical fiber 50 can readily be increased. Thus, output balance between the laser beam propagating through the center core 51 and the laser beam propagating through the ring core 53 can readily be adjusted. As a result, a laser beam having a desired beam profile can be outputted from the laser emission portion 4 of the laser apparatus 1.

Furthermore, the first laser sources 2A (e.g., an electric current supplied to the first laser sources 2A) can be controlled by the controller 5 to adjust outputs of the first laser beams generated by the first laser sources 2A. The second laser sources 2B (e.g., an electric current supplied to the second laser sources 2B) can be controlled by the controller 5 to adjust outputs of the second laser beams generated by the second laser sources 2B. Therefore, the first laser sources 2A and the second laser sources 2B can be controlled by the controller 5 to change a ratio of the powers of the first laser beams and the second laser beams, thereby adjusting a ratio of the first laser beams introduced to the center core 51 and the second laser beams introduced to the ring core 53 of the output optical fiber 50. Thus, a profile of the laser beam outputted from the laser emission portion 4 of the laser apparatus 1 can readily be adjusted to a desired shape.

In one or more embodiments, the core 31 of the intermediate optical fiber 30 is located within the area of the center core 51 of the output optical fiber 50. Therefore, a laser beam propagating through the core 31 of the intermediate optical fiber 30 can efficiently be introduced into the center core 51 of the output optical fiber 50. Similarly, in one or more embodiments, all of the cores 41 of the second input optical fibers 40 are located within the area of the ring core 53 of the output optical fiber 50. Therefore, laser beams propagating through the cores 41 of the second input optical fibers 40 can efficiently be introduced into the ring core 53 of the output optical fiber 50. In this case, some of the cores 41 of the second input optical fibers 40, not all of the cores 41 of the second input optical fibers 40, may be located within the area of the ring core 53 of the output optical fiber 50.

Additionally, as shown in FIG. 5, an outer peripheral edge of the cladding 32 of the intermediate optical fiber 30 may be located within an area of the inner cladding 52 of the output optical fiber 50 (the intermediate area between the inner hatched area and the outer hatched area) in one or more embodiments. When the outer peripheral edge of the cladding 32 of the intermediate optical fiber 30 is located within the area of the inner cladding 52 of the output optical fiber 50, all of the second input optical fibers 40, which are located outside of the intermediate optical fiber 30, are positioned in an area outside of the center core 51 of the output optical fiber 50. Therefore, the laser beams propagating through the cores 41 of the second input optical fibers 40 can be inhibited from mixing with the laser beams entering the center core 51 of the output optical fiber 50 from the core 31 of the intermediate optical fiber 30.

Furthermore, as shown in FIG. 5, at least a portion of an outer peripheral edge of each of the second input optical fibers 40 may be located within the area of the inner cladding 52 of the output optical fiber 50 (the intermediate area between the inner hatched area and the outer hatched area) in one or more embodiments. When at least a portion of an outer peripheral edge of each of the second input optical fibers 40 is located within the area of the inner cladding 52 of the output optical fiber 50, the intermediate optical fiber 30, which is located inside of the second input optical fiber 40, is likely to be located in an area inside of the ring core 53 of the output optical fiber 50. Therefore, the laser beam propagating through the core 31 of the intermediate optical fiber 30 can be inhibited from mixing with the laser beams entering the ring core 53 of the output optical fiber 50 from the cores 41 of the second input optical fibers 40.

For example, if reflection light returns from the laser emission portion 4, it may leak within the optical combiner 3. In the conventional optical combiner as disclosed in Patent Literature 1, inner optical fibers and outer optical fibers are connected to the same surface of an output optical fiber. Therefore, reflection light propagating through a center core of the output optical fiber and reflection light propagating through an outer core of the output optical fiber may leak out of the one surface of the output optical fiber, resulting in an increased amount of heat locally generated. In one or more embodiments, however, the first input optical fibers 10 are connected to the bridge input surface 26 of the bridge fiber 20, and the second input optical fibers 40 are connected to the output optical fiber 50. Therefore, reflection light propagating through the center core 51 of the output optical fiber 50 may leak out of the bridge input surface 26 of the bridge fiber 20, and reflection light propagating through the ring core 53 may leak out of an end face of the output optical fiber 50. In this manner, the reflection light propagating through the center core 51 and the reflection light propagating through the ring core 53 leak out of different surfaces. Thus, the reflection light can be dispersed to reduce local heat generation. Accordingly, the risk of failure of the optical combiner 3 is also reduced.

For example, when a workpiece of a thin metal plate is to be cut with the laser apparatus 1 according to one or more embodiments, the laser apparatus 1 may use a laser beam L having a circular shape with a small diameter where the optical power density is higher at the center thereof. When a workpiece of a thick metal plate is to be cut, the laser apparatus 1 may use a beam having an annular shape with a large diameter where the spot diameter or the rate of change in optical power density is small at a location deviated from a beam waist in the laser propagation direction (the thickness direction of the workpiece). Such a beam having an annular shape with a large diameter is suitable to cut a thick plate because it is advantageous in that it can increase the optical power density at the beam waist as compared to a beam having a circular shape under the conditions of the same beam diameter and the same beam output.

In the laser emission portion 4, however, if an angle at which a laser beam is emitted from the ring core 53 of the output optical fiber 50 is greater than an angle at which a laser beam is emitted from the center core 51 of the output optical fiber 50, then the advantages of the large-diameter annular-shaped beam suitable to cut a thick plate is lessened. This is because a decrease of the power density becomes greater with a larger emission angle at a location farther away from the focal point. Therefore, if a workpiece is thicker, a power density required to cut the workpiece cannot be obtained in the thickness direction.

From this point of view, the optical combiner 3 may be configured such that an angle of the laser beam emitted from the ring core 53 of the output optical fiber 50 is smaller than an angle of the laser beam emitted from the center core 51 of the output optical fiber 50. For example, when light sources with equivalent capability are used for the laser sources 2A and 2B, NA of light emitted to the ring core 53 of the output optical fiber 50 from the second input optical fibers 40 may be adjusted to be smaller than NA of light emitted to the center core 51 of the output optical fiber 50 from the first input optical fibers 10 through the bridge fiber 20 and the intermediate optical fiber 30. In this context, NA of light refers to a value defined by NA=n sin θ where n is a refractive index of a core through which a beam is propagating, and θ is a propagation angle of the beam. Furthermore, the term "equivalent capability" of laser sources is used herein to mean capability in such a range so as to accept manufacturing variations. For example, if the beam parameter product (BPP) is in a range of ±20%, such laser sources have equivalent capability.

In order to reduce the NA of light emitted from each of the second input optical fibers 40 to the ring core 53 of the output optical fiber 50, for example, a diameter reduction portion may be formed in the second input optical fiber 40 so that the second input optical fiber 40 has the smallest diameter at a portion where the second input optical fiber 40 is connected to the ring core 53 of the output optical fiber 50. In this case, a diameter reduction rate of the diameter reduction portion of the second input optical fiber 40 is defined as a rate of a diameter of the core 41 at a portion where the second input optical fiber 40 is not reduced in diameter to a diameter of the core 41 on an end face of the diameter reduction portion of the second input optical fiber 40 connected to the ring core 53 of the output optical fiber 50. In one or more embodiments for outputting a laser beam L suitable to cut a thick plate, the diameter reduction rate of the diameter reduction portion of the second input optical fiber 40 may be lower than a rate of a diameter of the core 21 on the bridge input surface 26 of the bridge fiber 20 to a diameter of the core 31 of the intermediate optical fiber 30 connected to the center core 51 of the output optical fiber 50.

Figure 6:
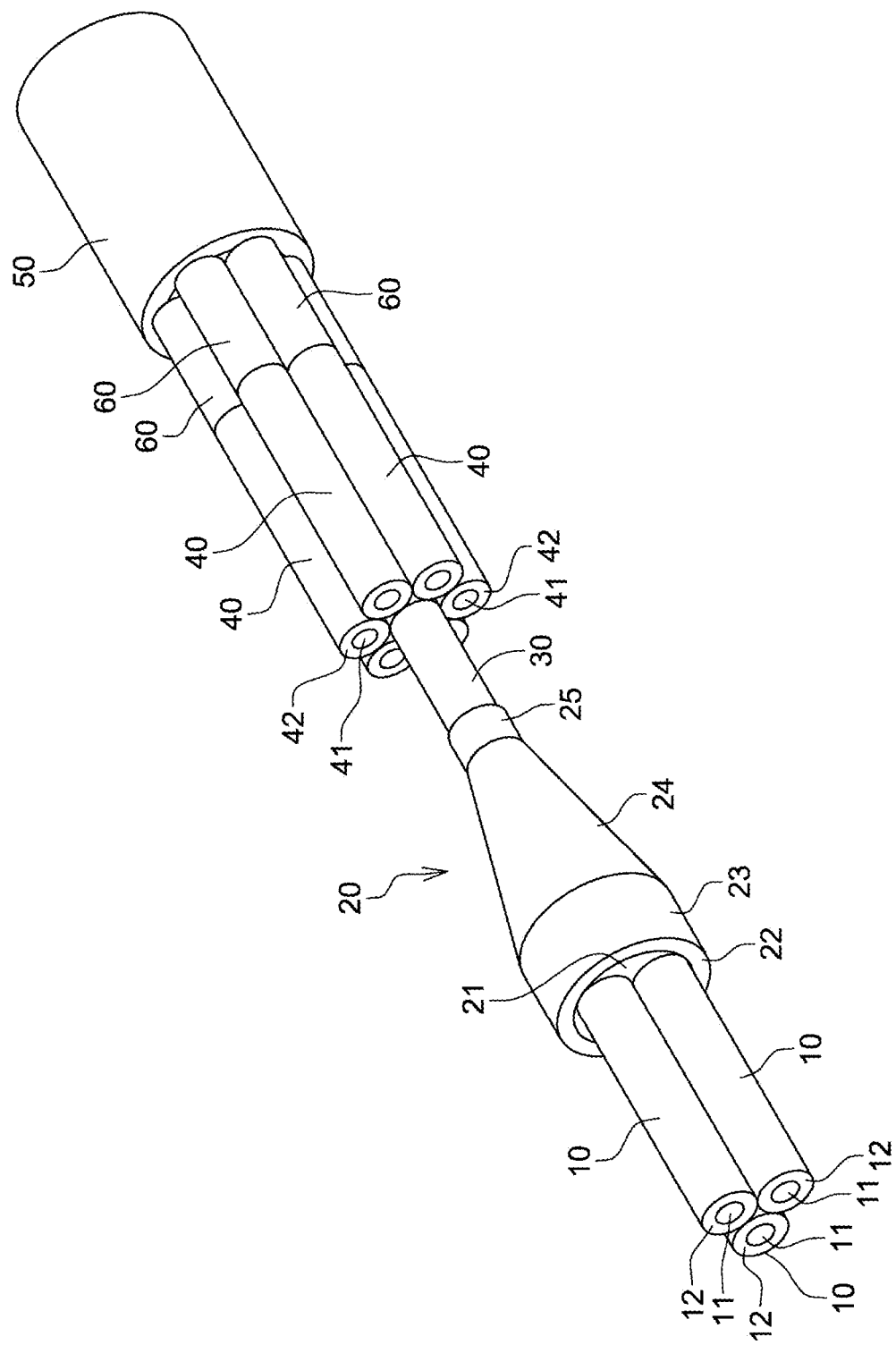
FIG. 6 is a perspective view showing an optical combiner according to one or more embodiments of the present invention.

Alternatively, as shown in FIG. 6, an optical adjustment member 60 having a function of reducing an emission angle of a laser beam propagating therethrough may be provided between each of the second input optical fibers 40 and the output optical fiber 50. Examples of such an optical adjustment member 60 include a Graded Index or Gradient Index (GRIN) lens member having a refractive index gradually lowered from a central axis in a radially outward direction. Such an optical adjustment member 60 can reduce an emission angle of a laser beam that has propagated through the core 41 of the second input optical fiber 40 before the laser beam enters the ring core 53 of the output optical fiber 50, so that the NA of the laser beam outputted from the ring core 53 of the laser emission portion 4 can be reduced. Accordingly, when such a laser beam is used to process a workpiece W, a beam diameter and an optical power density can be inhibited from varying on a front surface of the workpiece W, within the workpiece W, and on a rear surface of the workpiece W. Thus, a laser beam L suitable to process a thick metal plate, for example, can be directed to the workpiece W.

Meanwhile, if there is a difference between an emission angle of a laser beam emitted from the ring core 53 of the output optical fiber 50 and an emission angle of a laser beam emitted from the center core 51 of the output optical fiber 50 in the laser emission portion 4, then the laser beam from the ring core 53 and the laser beam from the center core 51 may overlap at a defocused location, which is deviated from a focal point of a condensing optical system, resulting in hindered processing performance. From this point of view, an optical adjustment member having a function of increasing an emission angle of a second laser beam propagating therethrough may be used instead of the optical adjustment members 60 illustrated in FIG. 6. Examples of such an optical adjustment member 60 may include an optical fiber having a mode field diameter greater than a mode field diameter of the second input optical fiber 40, a cylindrical lens member having a refractive index distribution in which a refractive index gradually increases from a central region toward a radially outer peripheral portion, a tapered member having a diameter gradually reduced from the second input optical fiber 40 along an optical axis, and a combination of two GRIN lenses.

Meanwhile, a cladding mode, which propagates through the cladding, may be generated when a laser beam leaks out of the core while it propagates through the aforementioned optical combiner 3. Such a cladding mode may cause heat generation at the output optical fiber 50 on a downstream side of the optical combiner 3. The cladding mode may be applied to an unintended area from the laser emission portion 4, resulting in degraded quality of laser processing.

Particularly, when the output optical fiber 50 include a plurality of cores 51 and 53 as in the above embodiments, cladding modes generated when laser beams are introduced into the respective cores 51 and 53 propagate through the claddings 52 and 54 of the same output optical fiber 50. Therefore, more cladding modes tend to propagate through the output optical fiber 50 as compared to a case where the output optical fiber 50 is formed by a single-core optical fiber. When a cladding mode stripper is provided in the middle of the output optical fiber 50 in order to remove such cladding modes, the amount of heat generated in the cladding mode stripper may increase so much that the cladding mode stripper cannot sufficiently remove the cladding modes.

Figure 7:
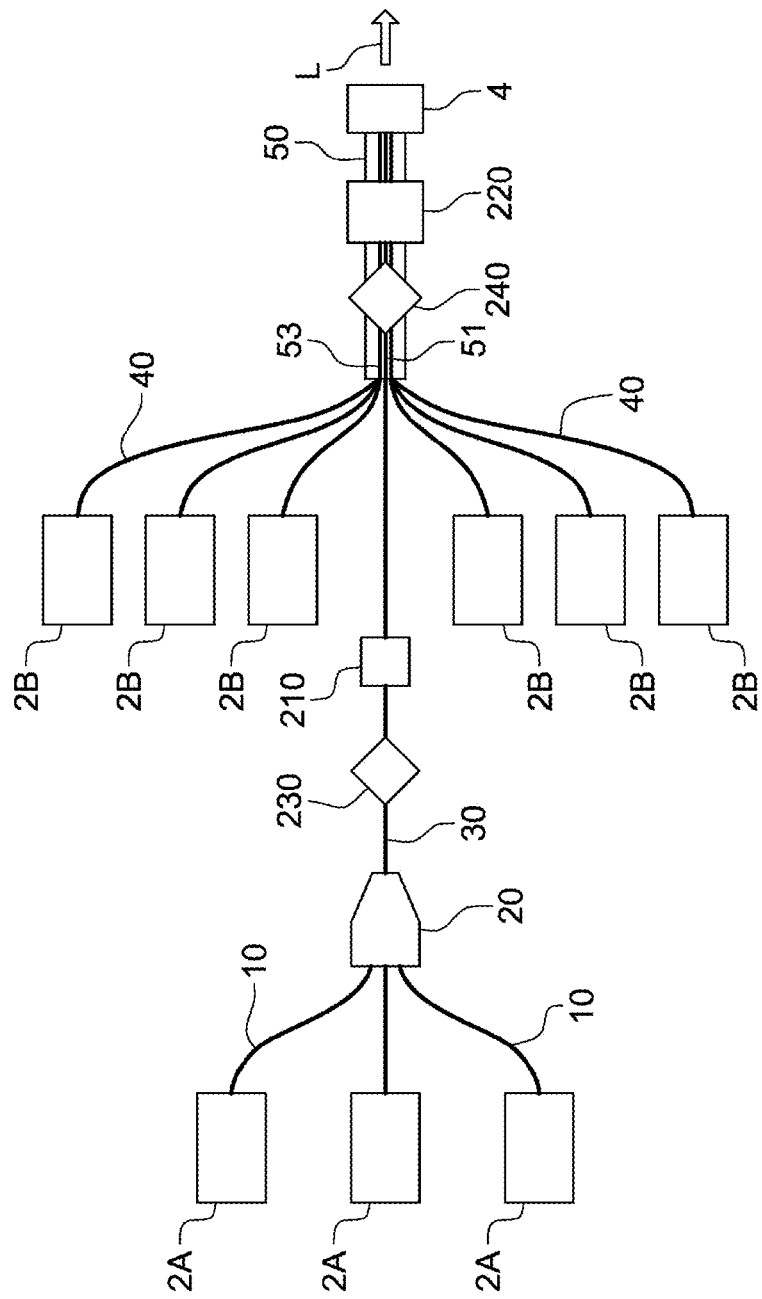
FIG. 7 is a schematic block diagram showing a configuration of a laser apparatus according to one or more embodiments of the present invention.

Therefore, as shown in FIG. 7, a first cladding mode removal portion 210 operable to remove cladding modes that have leaked out of the core 31 to the cladding 32 of the intermediate optical fiber 30 may be provided in the middle of the intermediate optical fiber 30, and a second cladding mode removal portion 220 operable to remove cladding modes that have leaked out of the ring core 53 to the outer cladding 54 of the output optical fiber 50 may be provided in the middle of the output optical fiber 50. With this configuration, cladding modes that have leaked to the cladding 32 of the intermediate optical fiber 30 can be removed by the first cladding mode removal portion 210 before entering the output optical fiber 50. Therefore, the amount of heat generated in the second cladding mode removal portion 220 can be reduced. Any known cladding mode removal structures may be used for the cladding mode removal portions 210 and 220.

It has been known that an emission angle of light emitted from an optical fiber increases when a load is applied to the optical fiber. In order to control an emission angle of a laser beam emitted from the center core 51 of the output optical fiber 50 and an emission angle of a laser beam emitted from the ring core 53 of the output optical fiber 50, therefore, a first optical control portion 230 that controls a load applied to the intermediate optical fiber 30 may be provided in the middle of the intermediate optical fiber 30 to control the NA of light propagating through the core 31 of the intermediate optical fiber 30. A second optical control portion 240 that controls a load applied to the output optical fiber 50 may be provided in the middle of the output optical fiber 50 to control the NA of light propagating through the center core 51 and the ring core 53 of the output optical fiber 50. Examples of such optical control portions 230 and 240 include a device for heating or forming a temperature distribution so as to apply a load to an optical fiber, a device for providing a bend to an optical fiber, and a device for applying a lateral pressure to an optical fiber.

A load applied to the output optical fiber 50 by the second optical control portion 240 primarily exerts an influence on light propagating through the ring core 53, which is located radially outside, and does not exert an influence so much on light propagating through the center core 51, which is located near the center. Meanwhile, light emitted from the intermediate optical fiber 30 to the center core 51 of the output optical fiber 50 is influenced by a load applied to the intermediate optical fiber 30 by the first optical control portion 230. Thus, an emission angle of a laser beam emitted from the center core 51 of the output optical fiber 50 can be controlled primarily by the first optical control portion 230, and an emission angle of a laser beam emitted from the ring core 53 of the output optical fiber 50 can be controlled primarily by the second optical control portion 240.

Both types of the cladding mode removal portions 210, 220 and the optical control portions 230, 240 may be provided as shown in FIG. 7. Alternatively, one type of them may be provided. If both types of the cladding mode removal portions 210, 220 and the optical control portions 230, 240 are provided, cladding modes may be generated by application of loads from the optical control portions 230 and 240. In order to efficiently remove the generated cladding modes, one or more embodiments may provide the first cladding mode removal portion 210 on a downstream side of the first optical control portion 230 and provide the second cladding mode removal portion 220 on a downstream side of the second optical control portion 240 as shown in FIG. 7.

Figure 8:
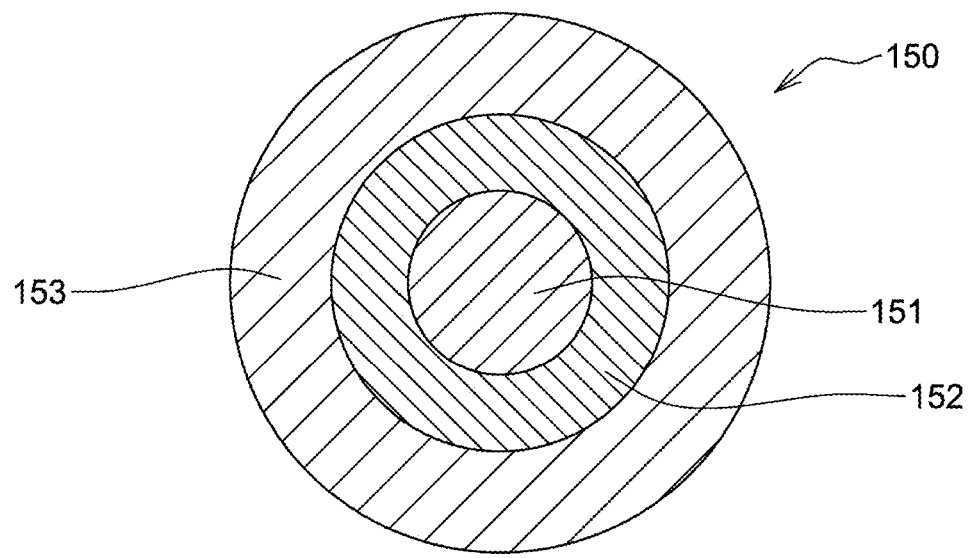
FIG. 8 is a diagram showing a cross-section of an output optical fiber according to one or more embodiments of the present invention along with a radial refractive index distribution.
Figure 8:
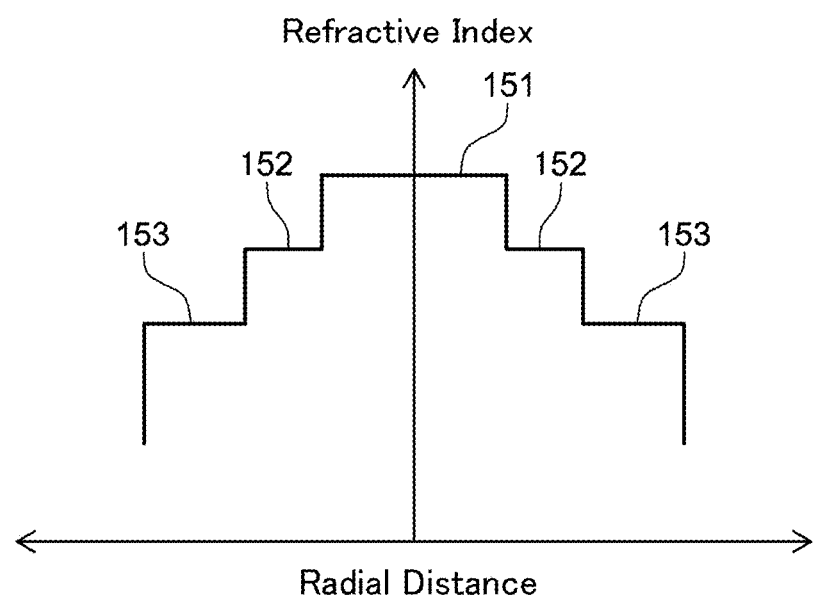

The aforementioned output optical fiber 50 is not limited to the structure illustrated in FIG. 4. For example, an output optical fiber 150 as shown in FIG. 8 may be used instead of the aforementioned output optical fiber 50. The output optical fiber 150 as shown in FIG. 8 has a core 151, an inner cladding 152 that surrounds an outer circumference of the core 151, and an outer cladding 153 that surrounds an outer circumference of the inner cladding 152. The inner cladding 152 has a refractive index lower than a refractive index of the core 151, and the outer cladding 153 has a refractive index lower than a refractive index of the inner cladding 152. Thus, an interior of the core 151 forms a first optical waveguide that allows a laser beam to propagate therethrough, and an interior of the inner cladding 152 and the core 151 forms a second optical waveguide that allows a laser beam to propagate therethrough. The core 31 of the intermediate optical fiber 30 is connected to the core 151 of the output optical fiber 150 by fusion splicing, and the core 41 of the second input optical fiber 40 is connected to the inner cladding 152 of the output optical fiber 150 by fusion splicing. The output optical fiber 150 has a covering layer (not shown) that surrounds an outer circumference of the outer cladding 153 at a location away from the intermediate optical fiber 30 and the second input optical fiber 40.

With this configuration, a laser beam that has propagated through the core 11 of the first input optical fiber 10 enters the core 21 of the bridge fiber 20 from the bridge input surface 26 of the bridge fiber 20. The laser beam is reduced in diameter by the diameter reduction portion 24 and introduced into the core 31 of the intermediate optical fiber 30 from the bridge output surface 27. The laser beam that has been introduced to the core 31 of the intermediate optical fiber 30 propagates through the core 31 and enters the core 151 of the output optical fiber 150. Then the laser beam propagates through the interior of the core 151 as the first optical waveguide. The laser beam is eventually emitted from the laser emission portion 4 (see FIG. 1). Furthermore, a laser beam that has propagated through the core 41 of the second input optical fiber 40 enters the inner cladding 152 of the output optical fiber 150 and propagates through the interior of the inner cladding 152 and the core 151 as the second optical waveguide. The laser beam is eventually emitted from the laser emission portion 4 (see FIG. 1).

In the output optical fiber 150 as shown in FIG. 8, the outer cladding 153 is formed around the inner cladding 152 as a low-refractive-index medium having a refractive index lower than the refractive index of the inner cladding 152. Such a low-refractive-index medium is not limited to a covering layer such as the outer cladding 153. For example, an air layer may be formed around the inner cladding 152 and may be used as a low-refractive-index medium.

In the aforementioned embodiments, a plurality of laser sources 2B and a plurality of input optical fibers 40 are provided. However, the number of input optical fibers 40 connected to a second optical waveguide of the output optical fiber 50 or 150 may be one, and the number of laser sources 2B connected to this input optical fiber 40 may be one. In the aforementioned embodiments, a laser source 2A is connected to each of the input optical fibers 10. However, a laser source 2A may not necessarily be connected to all of the input optical fibers 10. Thus, one or more laser sources 2A may be connected to one or more input optical fibers 10.

Although some embodiments of the present invention have been described, the present invention is not limited to the aforementioned embodiments. It should be understood that various different forms may be applied to the present invention within the technical idea thereof.

As described above, according to a first aspect of one or more embodiments of the present invention, there is provided an optical combiner that can readily be manufactured with capability of directing a laser beam into each of a first optical waveguide and a second optical waveguide of an output optical fiber. This optical combiner has a plurality of first input optical fibers each including a core, a bridge fiber having a bridge input surface connected to the cores of the plurality of first input optical fibers, a diameter reduction portion having a diameter gradually reduced away from the bridge input surface along an optical axis, and a bridge output surface located opposite to the bridge input surface along the optical axis, an intermediate optical fiber including a core connected to the bridge output surface of the bridge fiber, at least one second input optical fiber including a core, and an output optical fiber including a first optical waveguide connected to the core of the intermediate optical fiber and a second optical waveguide connected to the core of the at least one second input optical fiber.

With this configuration, light propagating through cores of a plurality of first input optical fibers is reduced in beam diameter in a bridge fiber and then introduced into a first optical waveguide of an output optical fiber. Therefore, the first input optical fibers can be connected to the bridge fiber without reduction of the diameter of the first input optical fibers. Accordingly, the mechanical strength of the first input optical fibers can be maintained. Thus, an optical combiner can readily be manufactured. Furthermore, the number of the first input optical fibers can be increased without reduction of the diameter of the first input optical fibers. Therefore, the power of laser beams introduced to the first optical waveguide of the output optical fiber can readily be increased. Thus, output balance between light propagating through the first optical waveguide and light propagating through the second optical waveguide can readily be adjusted.

The output optical fiber may include a center core, an inner cladding having a refractive index lowered than a refractive index of the center core and surrounding an outer circumference of the center core, a ring core having a refractive index higher than the refractive index of the inner cladding and surrounding an outer circumference of the inner cladding, and a low-refractive-index medium having a refractive index lower than the refractive index of the ring core and surrounding an outer circumference of the ring core. In this case, the center core forms the first optical waveguide, and the ring core forms the second optical waveguide.

An outer peripheral edge of the intermediate optical fiber may be located within an area of the inner cladding of the output optical fiber in one or more embodiments. In this case, the second input optical fiber, which is located outside of the intermediate optical fiber, is positioned in an area outside of the center core of the output optical fiber. Therefore, a laser beam propagating through the core of the second input optical fiber can be inhibited from mixing with a laser beam entering the center core of the output optical fiber from the core of the intermediate optical fiber.

The core of the intermediate optical fiber may be located within an area of the center core of the output optical fiber in one or more embodiments. In this case, a laser beam propagating through the core of the intermediate optical fiber can efficiently be introduced into the center core of the output optical fiber.

At least a portion of an outer peripheral edge of the at least one second input optical fiber may be located within an area of the inner cladding of the output optical fiber in one or more embodiments. In this case, the intermediate optical fiber, which is located radially inside of the second input optical fiber, is likely to be located in an area inside of the ring core of the output optical fiber. Therefore, a laser beam propagating through the core of the intermediate optical fiber can be inhibited from mixing with the laser beam entering the ring core of the output optical fiber from the core of the second input optical fiber.

The core of the at least one second input optical fiber may be located within an area of the ring core of the output optical fiber in one or more embodiments. In this case, a laser beam propagating through the core of the second input optical fiber can efficiently be introduced into the ring core of the output optical fiber.

The output optical fiber may include a core, an inner cladding having a refractive index lower than a refractive index of the core and surrounding an outer circumference of the core, and a low-refractive-index medium having a refractive index lower than the refractive index of the inner cladding and surrounding an outer circumference of the inner cladding. In this case, the core forms the first optical waveguide, and the core and the inner cladding form the second optical waveguide.

The at least one second input optical fiber may have a diameter reduction portion having the smallest diameter at a portion where the diameter reduction portion is connected to the second optical waveguide of the output optical fiber (see FIG. 3, inset). In this case, a diameter reduction rate of the diameter reduction portion of the at least one second input optical fiber may be lower than a ratio of a core of the bridge fiber at the bridge input surface to a diameter of the core of the intermediate optical fiber connected to the first optical waveguide of the output optical fiber.

According to a second aspect of one or more embodiments of the present invention, there is provided a laser apparatus capable of outputting a laser beam having a desired beam profile. The laser apparatus has at least one first laser source operable to generate a first laser beam, at least one second laser source operable to generate a second laser beam, and the aforementioned optical combiner. At least one of the plurality of first input optical fibers of the optical combiner is connected to the at least one first laser source. The at least one second input optical fiber of the optical combiner is connected to the at least one second laser source.

With the aforementioned optical combiner, output balance between the laser beam propagating through the first optical waveguide and the laser beam propagating through the second optical waveguide of the output optical fiber can readily be adjusted. Therefore, a laser beam having a desired beam profile can be outputted from the laser apparatus.

In one or more embodiments, the laser apparatus may further have a controller operable to control the at least one first laser source and the at least one second laser source to adjust an output of the first laser beam generated by the at least one first laser source and an output of the second laser beam generated by the at least one second laser source. With such a controller, a ratio of outputs of the first laser beam generated by the first laser source and the second laser beam generated by the second laser source can be changed to adjust a ratio of the first laser beam introduced to the first optical waveguide of the output optical fiber and the second laser beam introduced to the second optical waveguide of the output optical fiber. Therefore, a profile of the laser beam outputted from the laser apparatus can readily be adjusted to a desired shape.

When the at least one first laser source and the at least one second laser source have equivalent capability, an emission angle of the second laser beam outputted from the second optical waveguide of the output optical fiber through the at least one second input optical fiber connected to the at least one second laser source may be smaller than an emission angle of the first laser beam outputted from the first optical waveguide of the output optical fiber through at least one of the plurality of first input optical fibers connected to the at least one first laser source.

The laser apparatus may further have a first cladding mode removal portion operable to remove a cladding mode leaking out of the core of the intermediate optical fiber and a second cladding mode removal portion operable to remove a cladding mode leaking out of the second optical waveguide of the output optical fiber. With this configuration, a cladding mode that has leaked out of the core of the intermediate optical fiber can be removed by the first cladding mode removal portion before entering the output optical fiber. Therefore, the amount of heat generated in the second cladding mode removal portion can be reduced.

The laser apparatus may further have a first optical control portion operable to control a load applied to the intermediate optical fiber so as to control an emission angle of the first laser beam propagating through the core of the intermediate optical fiber and a second optical control portion operable to control a load applied to the output optical fiber so as to control an emission angle of the second laser beam propagating through the second optical waveguide of the output optical fiber. With this configuration, an emission angle of a first laser beam emitted from the first optical waveguide of the output optical fiber can be controlled primarily by the first optical control portion, and an emission angle of a second laser beam emitted from the second optical waveguide of the output optical fiber can be controlled primarily by the second optical control portion.

One or more embodiments of the present invention may be used for an optical combiner that combines laser beams from a plurality of input optical fibers and outputs the combined laser beam from an optical fiber.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE NUMERALS AND SIGNS

1 Laser apparatus
2A First laser source
2B Second laser source
3 Optical combiner
4 Laser emission portion
5 Controller
6, 7 Optical fiber
10 First input optical fiber
11 Core
12 Cladding
20 Bridge fiber
21 Core
22 Cladding 23 First cylindrical portion
24 Diameter reduction portion
25 Second cylindrical portion
26 Bridge input surface
27 Bridge output surface
30 Intermediate optical fiber
31 Core
32 Cladding
40 Second input optical fiber
41 Core
42 Cladding
50 Output optical fiber
51 Center core
52 Inner cladding
53 Ring core
54 Outer cladding (low-refractive-index medium)
60 Optical adjustment member
150 Output optical fiber
151 Core
152 Inner cladding
153 Outer cladding (low-refractive-index medium)
210 First cladding mode removal portion
220 Second cladding mode removal portion
230 First optical control portion
240 Second optical control portion

The invention claimed is:

1. An optical combiner comprising:
a plurality of first input optical fibers that each include a core;
a bridge fiber that includes:
   a bridge input surface including a single core, the single core being optically connected to all of the cores of the plurality of first input optical fibers;
   a diameter reduction portion having a diameter that decreases away from the bridge input surface along an optical axis of the optical combiner; and
   a bridge output surface located opposite to the bridge input surface along the optical axis;
an intermediate optical fiber that includes a core connected to the bridge output surface of the bridge fiber;
a second input optical fiber that includes a core; and
an output optical fiber that includes:
   a first optical waveguide connected to the core of the intermediate optical fiber; and
   a second optical waveguide connected to the core of the second input optical fiber.

2. The optical combiner as recited in claim 1, wherein the output optical fiber further includes:
   a center core;
   an inner cladding with a refractive index lower than a refractive index of the center core and that surrounds an outer circumference of the center core;
   a ring core with a refractive index higher than the refractive index of the inner cladding and that surrounds an outer circumference of the inner cladding; and
   a low-refractive-index medium with a refractive index lower than the refractive index of the ring core and that surrounds an outer circumference of the ring core,
the center core forms the first optical waveguide, and
the ring core forms the second optical waveguide.

3. The optical combiner as recited in claim 2, wherein an outer peripheral edge of the intermediate optical fiber is located within an area of the inner cladding of the output optical fiber.

4. The optical combiner as recited in claim 2, wherein the core of the intermediate optical fiber is located within an area of the center core of the output optical fiber.

5. The optical combiner as recited in claim 2, wherein a portion of an outer peripheral edge of the second input optical fiber is located within an area of the inner cladding of the output optical fiber.

6. The optical combiner as recited in claim 2, wherein the core of the second input optical fiber is located within an area of the ring core of the output optical fiber.

7. The optical combiner as recited in claim 1, wherein the output optical fiber further includes:
   a core;
   an inner cladding with a refractive index lower than a refractive index of the core of the output optical fiber and that surrounds an outer circumference of the core of the output optical fiber; and
   a low-refractive-index medium having a refractive index lower than the refractive index of the inner cladding and that surrounds an outer circumference of the inner cladding,
the core of the output optical fiber forms the first optical waveguide, and
the core of the output optical fiber and the inner cladding form the second optical waveguide.

8. The optical combiner as recited in claim 1, wherein
the second input optical fiber includes a diameter reduction portion, where the smallest diameter of the diameter reduction portion of the second input optical fiber is connected to the second optical waveguide of the output optical fiber, and
a diameter reduction rate of the diameter reduction portion of the second input optical fiber is lower than a ratio of a core of the bridge fiber at the bridge input surface to a diameter of the core of the intermediate optical fiber connected to the first optical waveguide of the output optical fiber.

9. A laser apparatus comprising:
a first laser source that generates a first laser beam;
a second laser source that generates a second laser beam; and
the optical combiner as recited in claim 1,
wherein at least one of the plurality of first input optical fibers of the optical combiner is connected to the first laser source, and
the second input optical fiber of the optical combiner is connected to the second laser source.

10. The laser apparatus as recited in claim 9, further comprising a controller that controls the first laser source and the second laser source to adjust an output of the first laser beam generated by the first laser source and an output of the second laser beam generated by the second laser source.

11. The laser apparatus as recited in claim 9, wherein
the first laser source and the second laser source have equivalent capability, and
an emission angle of the second laser beam outputted from the second optical waveguide of the output optical fiber through the second input optical fiber connected to the second laser source is smaller than an emission angle of the first laser beam outputted from the first optical waveguide of the output optical fiber through at least one of the plurality of first input optical fibers connected to the first laser source.

12. The laser apparatus as recited in claim 9, further comprising:

a first cladding mode removal portion that removes a cladding mode leaking out of the core of the intermediate optical fiber; and a second cladding mode removal portion that removes a cladding mode leaking out of the second optical waveguide of the output optical fiber.

13. The laser apparatus as recited in claim 9, further comprising:

a first optical control portion that controls a load applied to the intermediate optical fiber so as to control an emission angle of the first laser beam propagating through the core of the intermediate optical fiber; and a second optical control portion that controls a load applied to the output optical fiber so as to control an emission angle of the second laser beam propagating through the second optical waveguide of the output optical fiber.

* * * * *